United States Patent
Zeng et al.

(10) Patent No.: US 11,721,789 B2
(45) Date of Patent: *Aug. 8, 2023

(54) LIGHT-EMITTING DIODE DEVICE AND METHOD FOR MANUFACTURING THE SAME

(71) Applicant: XIAMEN SANAN OPTOELECTRONICS TECHNOLOGY CO., LTD., Xiamen (CN)

(72) Inventors: Jiangbin Zeng, Xiamen (CN); Anhe He, Xiamen (CN); Ling-yuan Hong, Xiamen (CN); Kang-Wei Peng, Xiamen (CN); Su-hui Lin, Xiamen (CN); Chia-Hung Chang, Xiamen (CN)

(73) Assignee: XIAMEN SANAN OPTOELECTRONICS TECHNOLOGY CO., LTD.

(*) Notice: Subject to any disclaimer, the term of this patent is extended or adjusted under 35 U.S.C. 154(b) by 0 days.

This patent is subject to a terminal disclaimer.

(21) Appl. No.: 17/806,528

(22) Filed: Jun. 13, 2022

(65) Prior Publication Data

US 2022/0302345 A1 Sep. 22, 2022

Related U.S. Application Data

(63) Continuation of application No. 17/019,857, filed on Sep. 14, 2020, now Pat. No. 11,393,950, which is a
(Continued)

(30) Foreign Application Priority Data

Mar. 16, 2018 (CN) .......................... 201810216614.1

(51) Int. Cl.
*H01L 33/22* (2010.01)
*H01L 33/10* (2010.01)
(Continued)

(52) U.S. Cl.
CPC ............ *H01L 33/22* (2013.01); *H01L 33/005* (2013.01); *H01L 33/10* (2013.01); *H01L 33/382* (2013.01); *H01L 2933/0016* (2013.01)

(58) Field of Classification Search
CPC ..... H01L 33/382; H01L 33/145; H01L 33/10; H01L 33/22; H01L 33/46; H01L 33/005;
(Continued)

(56) References Cited

U.S. PATENT DOCUMENTS

| 10,804,451 B2 | 10/2020 | Yahata |
| 2003/0081642 A1 | 5/2003 | Hwang et al. |

(Continued)

FOREIGN PATENT DOCUMENTS

| CN | 101515622 A | 8/2009 |
| CN | 108258093 A | 7/2018 |
| CN | 108447955 A | 8/2018 |

OTHER PUBLICATIONS

Search Report issued to PCT Application No. PCT/CN2019/072021 by the CNIPA dated Apr. 24, 2019.

*Primary Examiner* — Savitri Mulpuri
(74) *Attorney, Agent, or Firm* — Thomas|Horstemeyer, LLP (57) ABSTRACT

A light-emitting diode (LED) device includes a substrate, an epitaxial layered structure disposed on the substrate, a current-spreading layer disposed on the epitaxial layered structure, a current-blocking unit disposed on the current-spreading layer, and a distributed Bragg reflector. The epitaxial layered structure, the current-spreading layer and the current-blocking unit are covered by the distributed Bragg
(Continued)

reflector. One of the current-spreading layer, the current-blocking unit, and a combination thereof has a patterned rough structure. A method for manufacturing the LED device is also disclosed.

19 Claims, 5 Drawing Sheets

Related U.S. Application Data continuation-in-part of application No. PCT/CN2019/072021, filed on Jan. 16, 2019.

(51) Int. Cl.
*H01L 33/00* (2010.01)
*H01L 33/38* (2010.01)

(58) Field of Classification Search
CPC . H01L 2933/0016; H01L 33/20; H01L 33/44; H01L 33/42; H01L 33/007
See application file for complete search history.

(56) References Cited

U.S. PATENT DOCUMENTS

| | | |
|---|---|---|
| 2007/0069196 A1 | 3/2007 | Kako |
| 2011/0297914 A1 | 12/2011 | Zheng et al. |
| 2013/0292719 A1 | 11/2013 | Lee et al. |
| 2014/0124730 A1 | 5/2014 | Choi et al. |
| 2014/0159071 A1 | 6/2014 | Choi et al. |
| 2018/0138371 A1 | 5/2018 | Wu et al. |
| 2019/0067526 A1 | 2/2019 | Kim et al. |

LIGHT-EMITTING DIODE DEVICE AND METHOD FOR MANUFACTURING THE SAME

CROSS-REFERENCE TO RELATED APPLICATIONS

This application is a continuation application of U.S. patent application Ser. No. 17/019,857 filed on Sep. 14, 2020, which is a bypass continuation-in-part (CIP) application of PCT International Application No. PCT/CN2019/072021, filed on Jan. 16, 2019, which claims priority of Chinese Invention Patent Application No. 201810216614.1, filed on Mar. 16, 2018. The entire content of each of the International and Chinese patent applications is incorporated herein by reference.

FIELD

This disclosure relates to a semiconductor lighting device and a method for manufacturing the same, and more particularly to a light-emitting diode (LED) device and a method for manufacturing the same.

BACKGROUND

A semiconductor lighting device has various advantages, such as long service life, low energy cost, environmental friendliness, high safety, etc., and its use as a novel and highly efficient solid-state light source is deemed promising following the inventions of incandescent lights and fluorescent lights. The rapid increase in the applications of the semiconductor lighting device provides great economic and social benefits. Therefore, the lighting industry utilizing semiconductor lighting device is deemed as one of the emerging industries in the $21^{st}$ century, and is expected to contribute to the development of optoelectronic field within the next few years. A semiconductor lighting device, such as a light-emitting diode (LED) device, (i.e., also known as a fourth-generation light source), is generally made of semiconductor materials such as gallium nitride (GaN), gallium arsenide (GaAs), gallium phosphide (GaP), gallium arsenide phosphide (GaAsP), etc., and includes a P-N junction for emitting light, in which electrons diffuse from an N-region across the p-n junction into a P-region, and holes migrate from the P-region to the N-region, such that radiative recombination of the electrons and holes is allowed to proceed so as to emit light. Due to its small size, such LED device has been applied in various fields such as signal lights, displays, backlight sources, illuminations, and decoration lights for city-viewing.

A conventional flip-chip LED usually includes a distributed Bragg reflector that is directly formed on an electrically conductive transparent layer (e.g., indium tin oxide (ITO) layer), and that usually has a thickness of not less than 3 μm to ensure a reflective property thereof, which might limit a light extraction efficiency at an interface between the distributed Bragg reflector and the electrically conductive transparent layer, thereby reducing an overall light extraction efficiency of the conventional LED.

SUMMARY

Therefore, an object of the disclosure is to provide a light-emitting diode (LED) device and a method for manufacturing the same that can alleviate or eliminate at least one of the drawbacks of the prior art.

According to the disclosure, the LED device includes a substrate, an epitaxial layered structure, a current-spreading layer, a current-blocking unit, and a distributed Bragg reflector.

The epitaxial layered structure includes a first-type semiconductor layer, an active layer, and a second-type semiconductor layer that are sequentially formed on the substrate in such order. The epitaxial layered structure is formed with an indentation which extends through the second-type semiconductor layer and the active layer, and which terminates at the first-type semiconductor layer to expose a portion of the first-type semiconductor layer. The current-spreading layer is disposed on the epitaxial layered structure opposite to the substrate. The current-blocking unit is disposed on the current-spreading layer. The distributed Bragg reflector covers the epitaxial layered structure, the current-spreading layer, and the current-blocking unit, and extends into the indentation of the epitaxial layered structure. One of the current-spreading layer, the current-blocking unit, and a combination thereof has a patterned rough structure.

BRIEF DESCRIPTION OF THE DRAWINGS

Other features and advantages of the disclosure will become apparent in the following detailed description of the embodiments with reference to the accompanying drawings, in which:

FIGS. 1 to 11 are schematic views illustrating consecutive steps of a method for manufacturing a first embodiment of a light-emitting diode (LED) device according to the disclosure, in which

DETAILED DESCRIPTION

Before the disclosure is described in greater detail, it should be noted that where considered appropriate, reference numerals have been repeated among the figures to indicate corresponding or analogous elements, which may optionally have similar characteristics.

Figure 11:
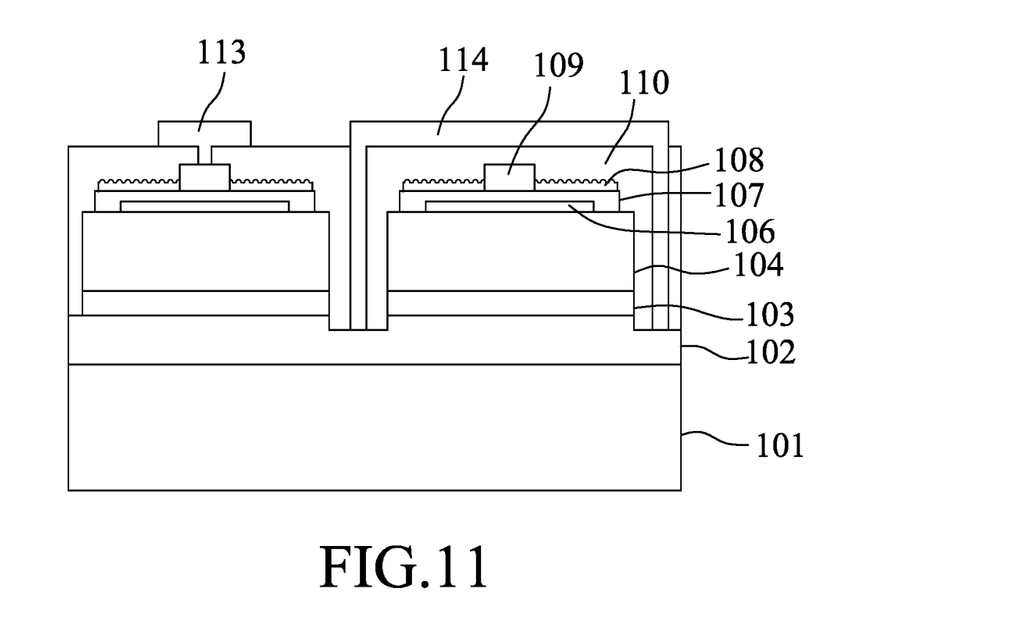

Referring to FIG. 11, a first embodiment of a light-emitting diode (LED) device according to the disclosure includes a substrate 101, an epitaxial layered structure, a current-spreading layer 107, a current-blocking unit, a distributed Bragg reflector 110, a P-type electrode unit, and an N-type electrode 114.

The substrate 101 may be one of a flat sapphire substrate, a patterned sapphire substrate, a silicon substrate, a silicon carbide substrate, a gallium nitride (GaN) substrate, and a gallium arsenide (GaAs) substrate. In this embodiment, the substrate 101 is a patterned sapphire substrate.

The epitaxial layered structure includes a first-type semiconductor layer 102, an active layer 103, and a second-type semiconductor layer 104 sequentially formed on the substrate 101 in such order.

The term "first-type" refers to being doped with a first type dopant, and the term "second-type" refers to being doped with a second type dopant that is opposite in conductivity to the first type dopant. For instance, the first type dopant may be an n-type dopant, and the second type dopant may be a p-type dopant, and vice versa.

In this embodiment, the first-type semiconductor layer 102 is an N-type semiconductor layer made of GaN, the active layer is made of a GaN-based material, and the second-type semiconductor layer 104 is a P-type semiconductor layer made of GaN. It should be noted that the materials for making the first-type semiconductor layer 102, the active layer 103, and the second-type semiconductor layer 104 are not limited to those disclosed herein, and may be modified based on practical requirements.

The epitaxial layered structure is formed with at least one indentation 105 (not shown in FIG. 11) which extends through the second-type semiconductor layer 103 and the active layer 103, and which terminates at the first-type semiconductor layer 102 to expose a portion of the first-type semiconductor layer 102.

The current-blocking unit is disposed on the current-spreading layer 107. In this embodiment, the current-blocking unit includes a first current-blocking layer 106, and a second current-blocking layer 108. The first current-blocking layer 106 is formed on the epitaxial layered structure opposite to the substrate 101. The current-spreading layer 107 is disposed over the first current-blocking layer 106, and is connected to the epitaxial layered structure. The second current-blocking layer 108 is formed on the current-spreading layer 107 opposite to the epitaxial layered structure, and is formed with an opening to expose a portion of the current-spreading layer 107.

Each of the first and second current-blocking layers 106, 108 may be made of a material having a relatively low refractive index (e.g., silicon dioxide), or a material having a relatively high refractive index (e.g., titanium dioxide), or may be a distributed Bragg reflector, but is not limited thereto. The current-spreading layer 107 may be, for example, an electrically conductive transparent layer made of indium tin oxide (ITO), zinc oxide (ZnO) or graphite, but is not limited thereto.

One of the current-blocking unit, the current-spreading layer 107, and combinations thereof has a patterned rough structure. For example, when the patterned rough structure is formed on the current-blocking unit (such as the first current-blocking layer 106), the light-exit surface area of the first current-blocking layer 106 may be increased to enhance the bonding strength between the first current-blocking layer 106 and the current-spreading layer 107. Similarly, when the patterned rough structure is formed on the current-spreading layer 107, the light-exit surface area of the current-spreading layer 107 may be increased to enhance the bonding strength between the current-spreading layer 107 and the second current-blocking layer 108.

The patterned rough structure may have a plurality of protrusions protruding in a direction away from the epitaxial layered structure. The protrusions may have any suitable shape and size. In certain embodiments, each of the protrusions is independently selected from a hemispherical protrusion, a conical protrusion, and a frustoconical protrusion. A projection of each of the protrusions on the epitaxial layered structure may have a diameter of not greater than 50 µm. Each of the protrusions may have a height of not less than 100 nm. A distance between two adjacent ones of the protrusions may be not greater than 20 µm.

Figure 7:
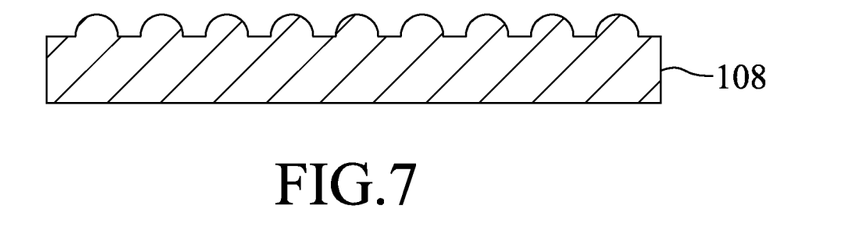
FIG. 7 is a partially enlarged view of FIG. 6 showing hemispherical protrusions of a patterned rough structure.

In this embodiment, the second current-blocking layer 108 of the current-blocking unit has the patterned rough structure which has a plurality of hemispherical protrusions (see FIG. 7). The projection of each of the hemispherical protrusions on the epitaxial layered structure has a diameter of 26 µm, each of the hemispherical protrusions has a height of 500 nm, and the distance between two adjacent ones of the hemispherical protrusions is 3 µm. With such configuration, the light-exit surface area of the second current-blocking layer 108 may be increased by about 100%.

The distributed Bragg reflector 110 covers the epitaxial layered structure, the first current-blocking layer 106, the current-spreading layer 107, and the second current-spreading layer 108, and extends into the indentation 105 of the epitaxial layered structure. In certain embodiments, the distributed Bragg reflector 110 has a thickness of not less than 3 µm, so as to exhibit an improved reflectivity.

In this embodiment, the distributed Bragg reflector 110 is formed with a first through hole 111 and a second through hole 112. The P-type electrode unit is formed in the first through hole 111 of the distributed Bragg reflector and includes a first P-type electrode 109 and a second P-type electrode 113. The first P-type electrode 109 is formed in the opening of the second current-blocking layer 108, and is electrically connected to the current-spreading layer 107. The second P-type electrode 113 is formed in the first through hole 111 and is electrically connected to the first P-type electrode 109.

The N-type electrode 114 is formed in the second through hole 112, and is electrically connected to the first-type semiconductor layer 102 of the epitaxial layered structure.

With the second current-blocking layer 108 being formed with the patterned rough structure, an interface between the second current-blocking layer 108 and the distributed Bragg reflector 110 may have an increased surface area, and therefore scattering of light entering the distributed Bragg reflector 110 may be increased, so as to improve a light extraction efficiency of the LED device of this disclosure. In addition, the patterned rough structure may increase a bonding strength between the second current-blocking layer 108 and the distributed Bragg reflector 110, thereby enhancing the reliability of the LED device.

Referring to FIGS. 1 to 11, a method for manufacturing the first embodiment of the LED device includes the following steps a) to g).

Figure 1:
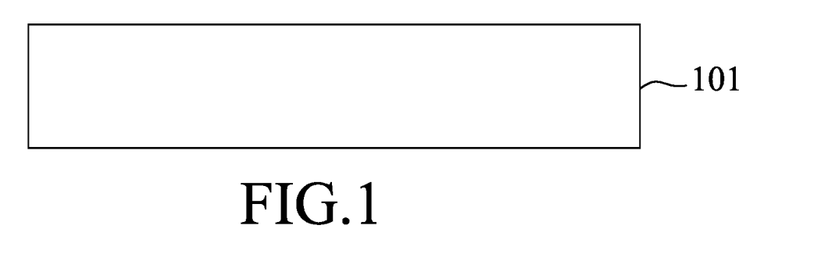
Figure 2:
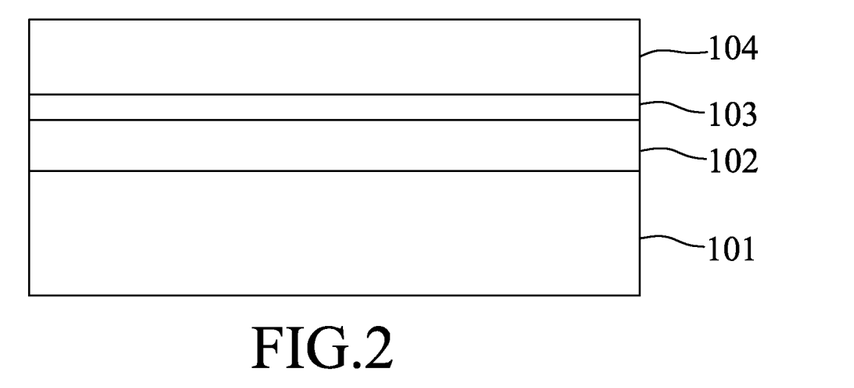

In step a), referring to FIGS. 1 and 2, the epitaxial layered structure is formed on the substrate 101 through, e.g., a metal organic chemical vapor deposition (MOCVD) process. The epitaxial layered structure includes the first-type semiconductor layer 102, the active layer 103, and the second-type semiconductor layer 104 that are sequentially stacked on the substrate 101 in such order.

Figure 3:
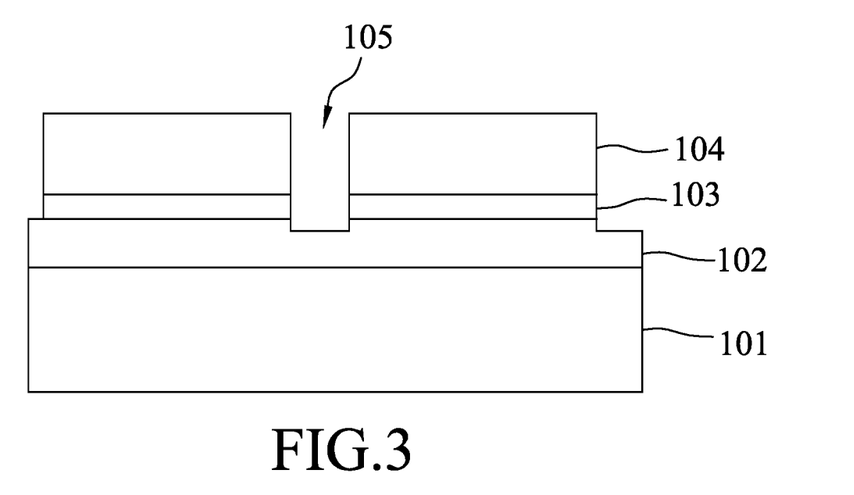
Figure 4:
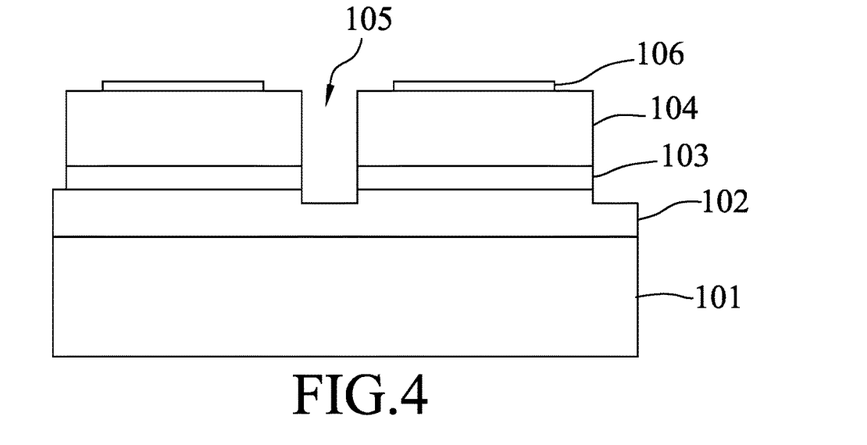

In step b), referring to FIG. 3, the epitaxial layered structure is etched to form the indentation 105 which extends through the second-type semiconductor layer 104 and the active layer 103, and which terminates at the first-type semiconductor layer 102 to expose a portion of the first-type semiconductor layer 101. The etching step may be conducted by an inductively coupled plasma (ICP) etching process or a reactive-ion etching (RIE) process.

Step c) is conducted as follows. Specifically, referring to FIG. 4, the first current-blocking layer 106 is firstly formed on the epitaxial layered structure opposite to the substrate 101 through, e.g., a MOCVD process and an etching process. The current-blocking layer 106 may be further formed with the abovementioned patterned rough structure on a surface opposite to the epitaxial layered structure via, e.g. photolithography and dry etching processes (not shown in the figures).

Figure 5:
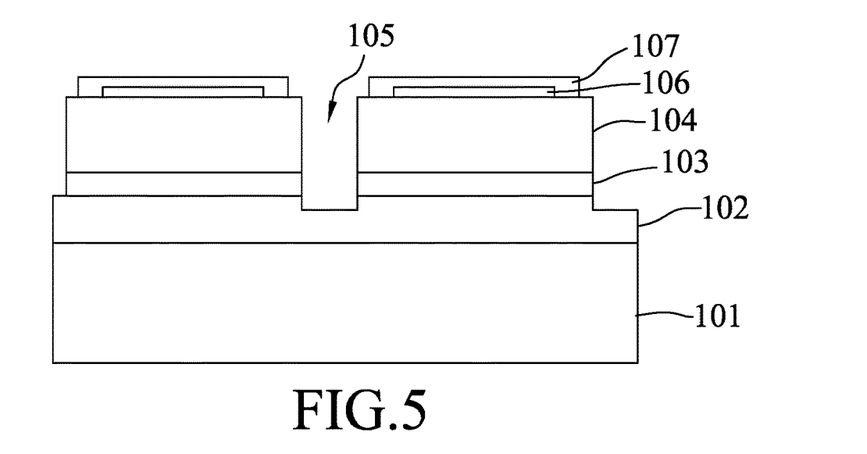

Referring to FIG. 5, the current-spreading layer 107 is then formed over the first current-blocking layer 106, and is connected to the epitaxial layered structure through, e.g., a vapor deposition process or a sputtering process. The current-spreading layer 107 may be further formed with the abovementioned patterned rough structure on a surface opposite to the first current-blocking layer 106 via, e.g., photolithography and dry etching processes (not shown in the figures).

Figure 6:
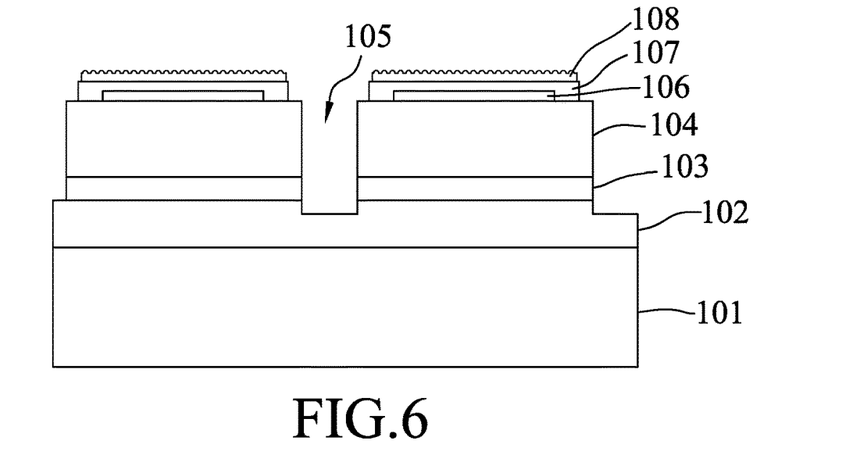

Referring to FIG. 6, the second current-blocking layer 108 is formed on the current-spreading layer 107 opposite to the first current-blocking layer 106 through, e.g., a vapor deposition process, and then is formed with the patterned rough structure through, e.g., photolithography and dry etching processes. Referring further to FIG. 7, the patterned rough structure includes multiple hemispherical protrusions protruding in a direction away from the current-spreading layer 107. The first and second current-blocking layers 106, 108 cooperate to form the current-blocking unit.

Figure 8:
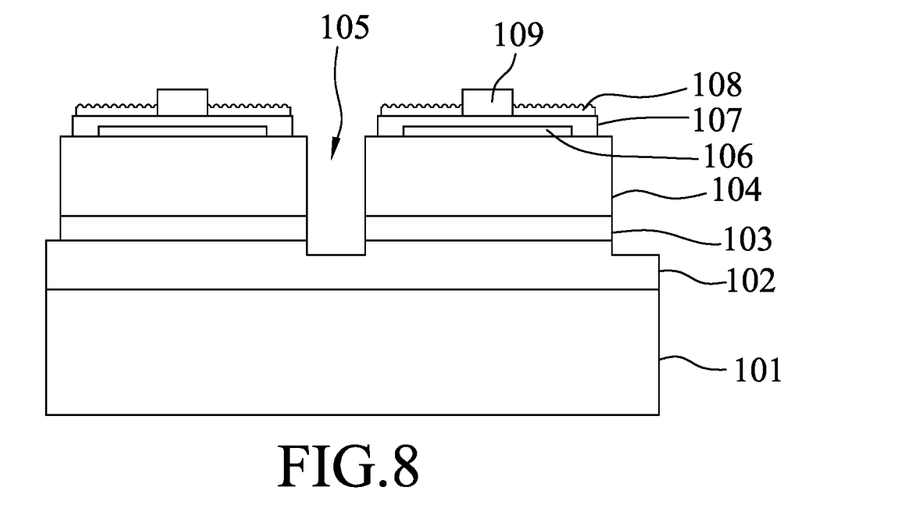

Afterwards, the second current-blocking layer 108 is subjected to an etching process (such as photolithography and dry etching processes) so as to form the opening to expose a portion of the current-spreading layer 107 (see FIG. 8).

Figure 9:
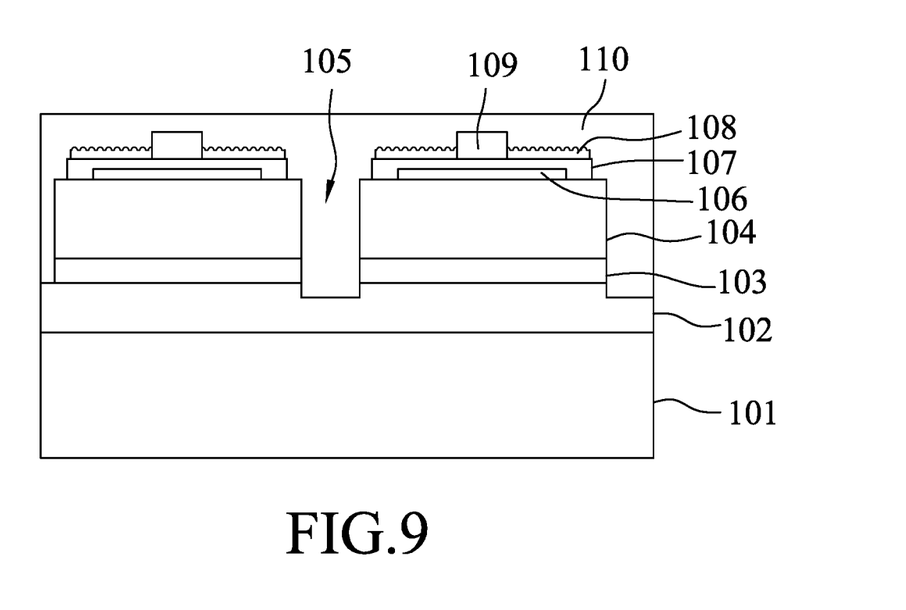

In step d), referring to FIG. 9, the distributed Bragg reflector 110 is formed by a chemical vapor deposition process to cover the epitaxial layered structure, the first current-blocking layer 106, the current-spreading layer 107, and the second current-blocking layer 108, and to extend into the indentation 105 of the epitaxial layered structure.

Figure 10:
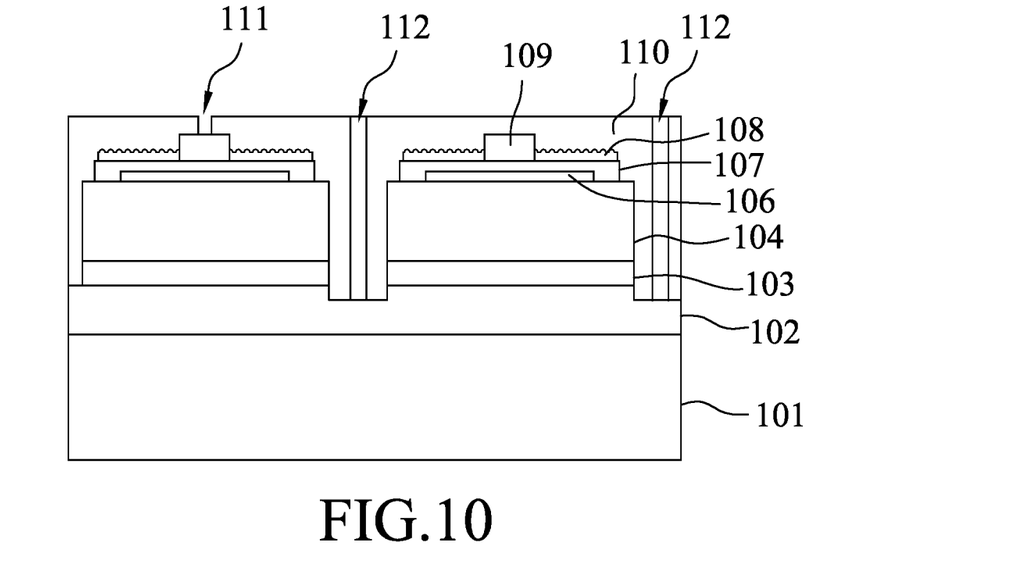

In step e), referring to FIG. 10, the distributed Bragg reflector 110 is subjected to a dry etching process, such that the first through hole 111 and the second through hole 112 are formed.

In step f), referring to FIG. 11, the P-type electrode unit is formed in the first through hole 111 and the N-type electrode 114 is formed in the second through hole 112. To be specific, the first P-type electrode 109 is formed in the opening of the second current-blocking layer 108 such that the first P-type electrode 109 is electrically connected to the current-spreading layer 107, and the second P-type electrode 113 is formed in the first through hole 111 of the distributed Bragg reflector 110. The second P-type electrode 113 is electrically connected to the first P-type electrode 109, and the N-type electrode 114 is electrically connected to the first-type semiconductor layer 102 of the epitaxial layered structure.

In certain embodiments, after step f), the substrate 101 is further subjected to a thinning process, and the resultant LED device may be diced to obtain an independent LED chip.

Figure 12:
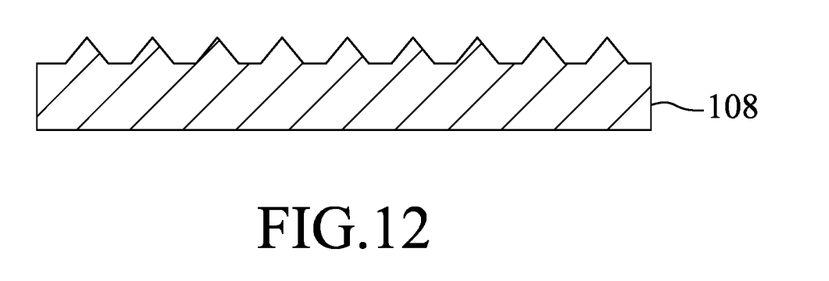
FIG. 12 is a cross-sectional schematic view illustrating conical protrusions of a patterned rough structure in a second embodiment of the LED device.

Referring to FIG. 12, a second embodiment of the LED device according to the disclosure is substantially similar to the first embodiment except that in the second embodiment, the protrusions of the patterned rough structure are conical protrusions. As such, the light-exit surface area of the second current-blocking layer 108 in the second embodiment may be increased by about 30%. As compared to the first embodiment, the conical protrusions can be made by a relatively simple process, and therefore the manufacturing cost of the second embodiment of the LED device can be reduced.

Figure 13:
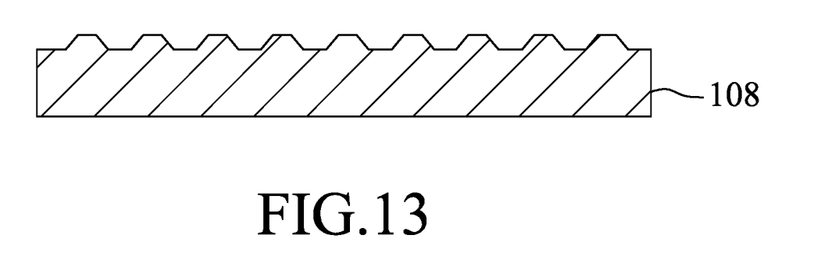
FIG. 13 is a cross-sectional schematic view illustrating frustoconical protrusions of a patterned rough structure in a third embodiment of the LED device.

Referring to FIG. 13, a third embodiment of the LED device according to the disclosure is substantially similar to the first embodiment except that in the third embodiment, the protrusions of the patterned rough structure are frustoconical protrusions. As such, the light-exit surface area of the second current-blocking layer 108 in the third embodiment may be increased by 20%. In addition, the frustoconical protrusions have relatively high mechanical stability, and therefore the third embodiment of the LED device may have a longer service life.

In sum, by formation of the patterned rough structure on at least one of the first current-blocking layer 106, the current-spreading layer 107, and the second current-blocking layer 108, the light-exit surface area of the LED device of this disclosure can be greatly increased, thereby improving the light extraction efficiency thereof. In addition, the patterned rough structure can increase a bonding strength between these layers, thereby enhancing the reliability of the LED device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting diode device, comprising:
a substrate;
an epitaxial layered structure which includes a first-type semiconductor layer, an active layer, and a second-type semiconductor layer sequentially formed on said substrate in such order, and which is formed with an indentation extending through said second-type semiconductor layer and said active layer and terminating at said first-type semiconductor layer to expose a portion of said first-type semiconductor layer;
a first current-blocking layer formed on said epitaxial layered structure opposite to said substrate;
a current-spreading layer which is disposed on said epitaxial layered structure opposite to said substrate, which is disposed over said first current-blocking layer, and which is connected to said epitaxial layered structure;
a second current-blocking layer which is formed on said current-spreading layer opposite to said epitaxial layered structure; and
a distributed Bragg reflector which covers said epitaxial layered structure, said current-spreading layer, and said second current-blocking layer.
2. The light-emitting diode device according to claim 1, wherein a width of said second current-blocking layer is larger than a width of said first current-blocking layer.

3. The light-emitting diode device according to claim 1, wherein an area of said second current-blocking layer is larger than an area of said first current-blocking layer.

4. The light-emitting diode device according to claim 3, wherein said first current-blocking layer is made of a material having a relatively low refractive index, and said second current-blocking layer is made of a material having a relatively high refractive index.

5. The light-emitting diode device according to claim 1, wherein said distributed Bragg reflector has a thickness of not less than 3 μm.

6. The light-emitting diode according to claim 1, wherein said second current-blocking layer is formed with an opening, and said light-emitting diode further includes a first electrode unit that contains a first electrode disposed on said current-spreading layer and extending into said opening of said second current-blocking layer.

7. The light-emitting diode according to claim 1, wherein said distributed Bragg reflector is formed with a first through hole, and said light-emitting diode further includes a first electrode unit that contains a second electrode being formed in said first through hole and being electrically connected to said current-spreading layer.

8. The light-emitting diode device according to claim 6, wherein said first current-blocking layer is under said first electrode unit, and said second current-blocking layer surrounds said first electrode of said first electrode unit.

9. The light-emitting diode device according to claim 1, wherein one of said current-spreading layer, said first current-blocking layer, said second current-blocking layer and a combination thereof has an upper surface with a patterned rough structure.

10. The light-emitting diode according to claim 9, wherein said second current-blocking layer has said upper surface with said patterned rough structure, each of said first current-blocking layer and said current-spreading layer has a smooth upper surface.

11. The light-emitting diode according to claim 6, wherein said first current-blocking layer is under said first electrode unit.

12. The light-emitting diode according to claim 6, wherein said distributed Bragg reflector is formed with a first through hole, and said first electrode unit further contains a second electrode disposed on said distributed Bragg reflector and electrically connected to said first electrode through said first through hole.

13. The light-emitting diode according to claim 12, wherein said distributed Bragg reflector is formed with a second through hole, and said light-emitting diode further includes a second electrode unit disposed on said distributed Bragg reflector and electrically connected to said first-type semiconductor layer through said second through hole.

14. The light-emitting diode device according to claim 10, wherein said patterned rough structure has a plurality of protrusions that protrude in a direction away from said epitaxial layered structure.

15. The light-emitting diode device according to claim 14, wherein each of said protrusions is one of a hemispherical protrusion, a conical protrusion, and a frustoconical protrusion.

16. The light-emitting diode device according to claim 15, wherein a projection of each of said protrusions on said epitaxial layered structure has a diameter of not greater than 50 μm.

17. The light-emitting diode device according to claim 14, wherein each of said protrusions has a height of not less than 100 nm.

18. The light-emitting diode device according to claim 14, wherein a distance between two adjacent ones of said protrusions is not greater than 20 μm.

19. The light-emitting diode device according to claim 14, wherein said current-spreading layer is transparent.

\* \* \* \* \*